United States Patent
Jo et al.

(10) Patent No.: US 11,343,416 B2
(45) Date of Patent: May 24, 2022

(54) CAMERA MODULE ASSEMBLY INCLUDING FLEXIBLE CIRCUIT BOARD MAINTAINED IN BENT STATE AND ELECTRONIC DEVICE INCLUDING SAME

(71) Applicant: Samsung Electronics Co., Ltd., Suwon-si (KR)

(72) Inventors: Myungjae Jo, Suwon-si (KR); Kwangmin Gil, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 98 days.

(21) Appl. No.: 16/975,047

(22) PCT Filed: Feb. 20, 2019

(86) PCT No.: PCT/KR2019/002037
§ 371 (c)(1),
(2) Date: Aug. 21, 2020

(87) PCT Pub. No.: WO2019/164242
PCT Pub. Date: Aug. 29, 2019

(65) Prior Publication Data
US 2021/0014392 A1    Jan. 14, 2021

(30) Foreign Application Priority Data
Feb. 23, 2018  (KR) ........................ 10-2018-0021629

(51) Int. Cl.
*H04N 5/225*  (2006.01)
*H05K 1/02*  (2006.01)

(52) U.S. Cl.
CPC ......... *H04N 5/2253* (2013.01); *H04N 5/2252* (2013.01); *H04N 5/2254* (2013.01); *H05K 1/028* (2013.01); *H05K 2201/10121* (2013.01)

(58) Field of Classification Search
CPC ..... H04M 1/02; H04N 5/2252; H04N 5/2253; H04N 5/2254; H04N 5/2257;
(Continued)

(56) References Cited

U.S. PATENT DOCUMENTS

| 8,734,000 | B2 * | 5/2014 | Chiang | H05K 1/147 362/631 |
| 2005/0195578 | A1 * | 9/2005 | Chang | G02F 1/13452 361/749 |

(Continued)

FOREIGN PATENT DOCUMENTS

| KR | 10-0722618 B1 | 5/2007 |
| KR | 10-2007-0060703 A | 6/2007 |

(Continued)

OTHER PUBLICATIONS

International Search Report and Written Opinion of the International Searching Authority in connection with International Application No. PCT/KR2019/002037 dated May 24, 2019, 8 pages.

*Primary Examiner* — Amy R Hsu

(57) ABSTRACT

Various embodiments related to a camera module assembly are presented and, according to one embodiment, the camera module assembly comprises: at least one camera module including a lens assembly, an image sensor configured to receive light having passed through the lens assembly, a camera housing for accommodating the lens assembly and the image sensor therein, a circuit board having the image sensor arranged thereon, and a flexible printed circuit board electrically connected with the circuit board and including wiring and a connector, which are for connecting the image sensor with an external device; and a support member including an opening for accommodating the at least one camera module in at least a part thereof, wherein the support member can be formed such that at least a part of the flexible printed circuit board is maintained in a bent state through at (Continued)

least a part of the opening, and additional other various embodiments are possible.

13 Claims, 14 Drawing Sheets

(58) Field of Classification Search
CPC ...... H04N 5/2258; H05K 1/028; H05K 1/147; H05K 2201/10121; H05K 2201/10151; H05K 2201/10189; H05K 2201/10522
See application file for complete search history.

(56) References Cited

U.S. PATENT DOCUMENTS

| | | | | |
|---|---|---|---|---|
| 2012/0020096 | A1* | 1/2012 | Chiang | H05K 1/147 362/382 |
| 2014/0218602 | A1* | 8/2014 | Kim | G06F 1/1605 348/373 |
| 2015/0114694 | A1* | 4/2015 | Liu | H05K 3/361 174/255 |
| 2016/0065801 | A1* | 3/2016 | Bae | H04N 5/2257 348/376 |
| 2016/0270234 | A1* | 9/2016 | Ahn | G06F 3/047 |

FOREIGN PATENT DOCUMENTS

| | | |
|---|---|---|
| KR | 10-2008-0086635 A | 9/2008 |
| KR | 10-2013-0061322 A | 6/2013 |
| KR | 10-2013-0088980 A | 8/2013 |
| KR | 10-2014-0115391 A | 10/2014 |
| KR | 10-2016-0026327 A | 3/2016 |

* cited by examiner

CAMERA MODULE ASSEMBLY INCLUDING FLEXIBLE CIRCUIT BOARD MAINTAINED IN BENT STATE AND ELECTRONIC DEVICE INCLUDING SAME

CROSS-REFERENCE TO RELATED APPLICATIONS

This application is a National Phase Entry of PCT International Application No. PCT/KR2019/002037, which was filed on Feb. 20, 2019 and claims priority to Korean Patent Application No. 10-2018-0021629, which was filed on Feb. 23, 2018, the contents of which are incorporated herein by reference.

BACKGROUND

1. Field

Various embodiments of the disclosure relate to a camera module assembly including a flexible circuit board and an electronic device including the same.

2. Description of the Related Art

Electronic devices may refer to devices, such as electronic notes, portable multimedia players, mobile communication terminals, tablet PCs, image/sound devices, desktop/laptop computers, and vehicular navigation systems, including home appliances, which perform specific functions according to mounted programs. For example, the electronic device may output stored information through sounds or images.

Electronic devices have started to employ small-sized and lightweight cameras, and the cameras have been mounted on the electronic devices.

SUMMARY

A camera may provide a flexible circuit board including a connector connected to a printed circuit board included in an electronic device. When a connector of the flexible circuit board and a connection terminal of the printed circuit board are connected to each other when being assembled, the location of the connector may be changed according to a bending shape of the flexible circuit board, and accordingly, it may be difficult to assemble the connector with the connection terminal as the location of the connector is changed, and the connector may be damaged or a defection in the assembly of the connector may be caused while the connector and the connection terminal are misaligned.

Accordingly, various embodiments of the disclosure may provide a camera module assembly in which a flexible circuit board of a camera module is maintained in a bent state whereby a connector of the flexible circuit board and a connection terminal of a printed circuit board can be easily assembled, and accordingly, damage to the connector of the flexible circuit board can be prevented and a defect of the assembly can be prevented.

In accordance with various embodiments of the disclosure, there is provided a camera module assembly including: at least one camera module including a lens assembly, an image sensor for receiving light that passed through the lens assembly, a camera housing for accommodating the lens assembly and the image sensor, a circuit board, in which the image sensor is disposed, and a flexible printed circuit board electrically connected to the circuit board and including a wiring line and a connector for connecting the image sensor and an external device; and a support member including an opening for accommodating the at least one camera module at at least a portion thereof, wherein the support member is configured such that at least a portion of the flexible circuit board is maintained in a bent state through at least a portion of the opening.

In accordance with another aspect of the disclosure, there is provided a camera module assembly including: at least one camera module including a lens assembly, an image sensor for receiving light that passed through the lens assembly, a camera housing for accommodating the lens assembly and the image sensor, a circuit board, in which the image sensor is disposed, and a flexible printed circuit board electrically connected to the circuit board and including a wiring line and a connector for connecting the image sensor and an external device; and a support member including an opening for accommodating the at least one camera module at at least a portion thereof, and the support member may include a guide part configured to guide the flexible circuit board such that at least a portion of the flexible circuit board is maintained in a bent state through at least a portion of the opening.

In accordance with another aspect of the disclosure, there is provided an electronic device including a camera module assembly including: a housing including a front plate, a rear plate facing from a direction that is opposite to the front plate, and a side surface surrounding a space between the front plate and the rear plate, wherein the front plate and the rear plate include an at least partially transparent portion; at least one camera module including a lens assembly located in the interior of the housing and facing the at least partially transparent portion of the housing, an image sensor for receiving light that passed through the lens assembly, a camera housing for accommodating the lens assembly and the image sensor, a circuit board, in which the image sensor is disposed, and a flexible printed circuit board electrically connected to the circuit board and including a wiring line and a connector for connecting the image sensor and an external device; and a support member including an opening for accommodating the camera module at at least a portion thereof, and wherein the support member is configured such that at least a portion of the flexible circuit board is maintained in a bent state through at least a portion of the opening.

In accordance with another aspect of the disclosure, there is provided a camera module assembly including: at least one camera module including a flexible printed circuit board; and a support member including an opening for accommodating the at least one camera module, wherein the support member includes: a guide part configured to guide the flexible circuit board such that at least a portion of the flexible circuit board is maintained in a bent state at at least a location of the opening.

According to various embodiments of the disclosure, because a guide part that guides the flexible circuit board of the camera module such that the flexible circuit board is maintained in a bent state is provided, the connector of the flexible circuit board can be guided to a location at which the connector may be easily assembled with the connection terminal of the printed circuit board while the location of the connector is not changed, and accordingly, the assembly performance of the flexible printed circuit board can be improved, a damage to the connector can be prevented, and a defect in the assembly can be prevented.

DETAILED DESCRIPTION

Figure 1A:
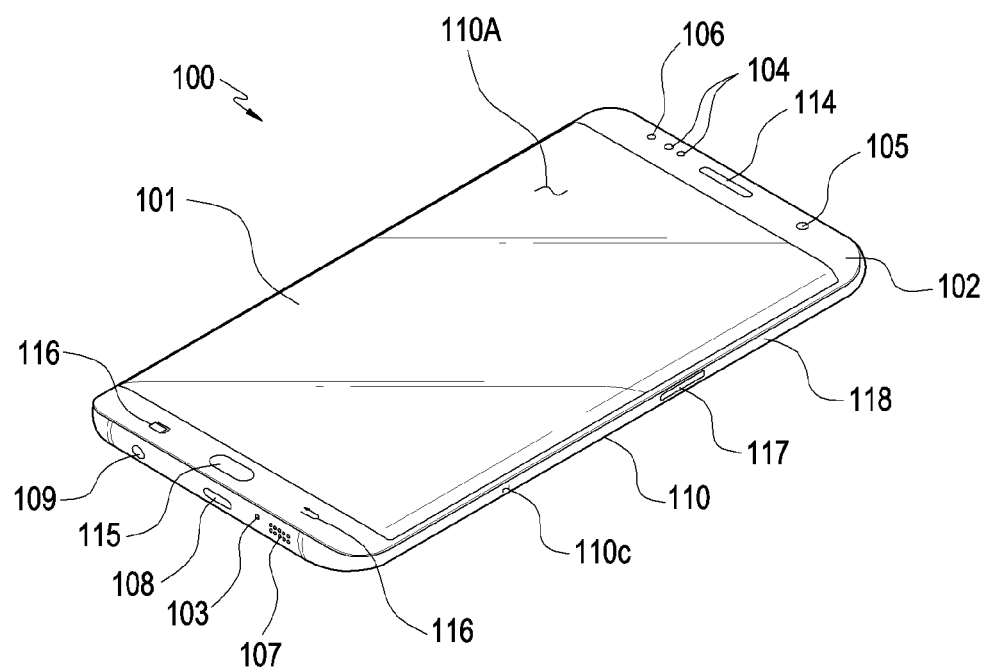
FIG. 1A is a front view illustrating an electronic device according to various embodiments of the disclosure.

The electronic device according to various embodiments may be one of various types of electronic devices. The electronic devices may include, for example, a computer device, a portable communication device (e.g., a smart phone), a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular expression may include a plural expression, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. Such terms as "1st" and "2nd," or "first" and "second" may represent corresponding components regardless of order or importance, may be used to simply distinguish one component from another, and do not limit the corresponding components. When it is described that an element (e.g., a first element) is "(operatively or communicatively coupled with/to" or "connected" to another element (e.g., a second element), the element can be directly connected to the other element or can be connected to the other element through another element (e.g., a third element).

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, the module may be implemented as an application-specific integrated circuit (ASIC).

Various embodiments as set forth herein may be implemented as software (e.g., the program 240) including an instruction that is stored in a machine-readable storage medium (e.g., internal memory 236 or external memory 238) that is readable by a machine (e.g., a computer). The machine is a device capable of invoking the stored instruction and operating according to the invoked instruction, and may include the electronic device (e.g., the electronic device 201) according to the embodiments set forth herein. When the instruction is executed by the processor (e.g., the processor 220), the processor may perform functions corresponding to the instruction directly, or functions corresponding to the instruction can be performed using other components under the control of the processor. The instruction may include a code generated by a complier or a code executable by an interpreter. The machine-readable storage medium may be provided in the form of a non-transitory storage medium. Wherein, the term "non-transitory" simply means that the storage medium is a tangible device, and does not include a signal, but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed online via an application store (e.g., Play Store™). If distributed online, at least part of the computer program product may be temporarily generated or at least temporarily stored in the machine-readable storage medium, such as memory of the manufacturer's server, a server of the application store, or a relay server.

Each component (e.g., a module or a program) according to various embodiments may include a single entity or multiple entities. Some of the above-described sub-components may be omitted, or one or more other components may be added to various embodiments. Alternatively or additionally, some components (e.g., modules or programs) may be integrated into a single entity, and the single entity may still perform one or more functions of each of some components in the same or similar manner as they are performed by a corresponding one of some components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 1B:
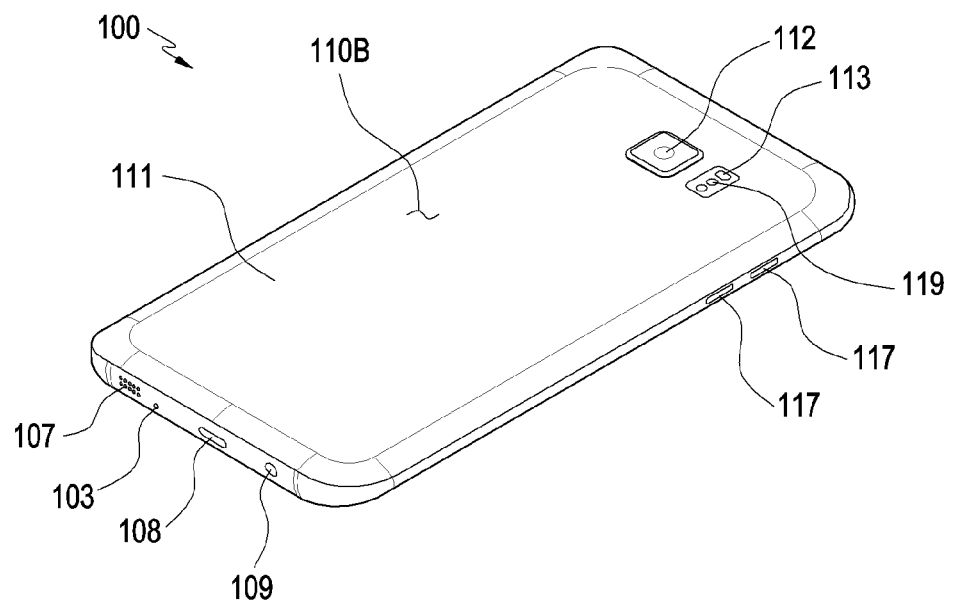
FIG. 1B is a rear view illustrating an electronic device according to various embodiments of the disclosure.

Referring to FIGS. 1A and 1B, an electronic device 100 according to an embodiment may include a housing 110 including a first surface (or a front surface) 110A, a second surface (or a rear surface) 110B, and a side surface 110C surrounding a space between the first surface 110A and the second surface 110B. In another embodiment (not illustrated), the housing may refer to a structure that defines some of the first surface 110A, the second surface 110B, and the side surface 110C of FIG. 1. According to an embodiment, the first surface 110A may be defined by a front plate 102 (e.g., a glass plate or a polymer plate including various coating layers), at least a portion of which is substantially transparent. The second surface 110B may be defined by a rear plate 111 that is substantially opaque. The rear plate 111, for example, may be formed of coated or colored glass, ceramics, a polymer, a metal (e.g., aluminum, stainless steel (STS), or magnesium), or a combination of at least two thereof. The side surface 110C is coupled to the front plate 102 and the rear plate 111, and may be defined by a side bezel structure (or 'a side member') 118 including a metal and/or a polymer. In some embodiments, the rear plate 111 and the side bezel structure 118 may be integrally formed and may include the same material (e.g., a metallic material such as aluminum).

In the illustrated embodiment, the front plate 102 may include first areas 110D that are deflected from the first surface 110A toward the rear plate and extend seamlessly, at opposite ends of a long edge of the front plate. In the illustrated embodiment (see FIG. 2), the rear plate 111 may include second areas 110E that are deflected from the second surface 110B toward the front plate 102 and extend seamlessly, at opposite ends of a long edge of the rear plate 111. In some embodiments, the front plate or the rear plate may include only one of the first area or the second area. In the embodiments, when viewed from a side of the electronic device, the side bezel structure may have a first thickness (or width) on a side surface that includes neither the first area nor the second area, and may have a second thickness that is smaller than the first thickness on a side that includes the first area or the second area.

According to an embodiment, the electronic device 100 may include at least one of a display 101, audio modules 103, 107, and 114, sensor modules 104 and 119, camera modules 105, 112, and 113, a key input device 115, 116, and 117, an indicator 106, and connector holes 108 and 109. In some embodiments, at least one (e.g., the key input device 115, 116, and 117 or the indicator 106) of the elements may be omitted from the electronic device 100 or another component may be additionally included in the electronic device 100.

The display 101, for example, may be exposed through a considerable portion of the front plate 101. In some embodiments, at least a portion of the display 101 may be exposed through the front plate 102 defining the first surface 110A, and the first areas 110D of the side surface 110C. The display 101 may be coupled to or be disposed to be adjacent to a touch detection circuit, a pressure sensor that may measure the strength (the pressure) of a touch, and/or a digitizer that detects a stylus pen of a magnetic field type. In some embodiments, at least a portion of the sensor modules 104 and 119 and/or at least a portion of the key input device 115, 116, and 117 may be disposed in the first areas 110D and/or the second areas 110E.

The audio modules 103, 107, and 114 may include a microphone hole 103 and speaker holes 107 and 114. A microphone for acquiring external sounds may be disposed in the microphone hole 103, and in some embodiments, a plurality of microphones may be disposed to detect the direction of a sound. The speaker holes 107 and 114 may include an external speaker hole 107 and a receiver hole 114 for a voice communication. In some embodiments, the speaker hole 107 and 114 and the microphone hole 103 may be realized by one hole or a speaker may be included while a speaker hole 107 and 114 is not employed (e.g., a piezoelectric speaker).

The sensor modules 104 and 119 may generate an electrical signal or a data value corresponding to an operational state of the interior of the electronic device 100 or an environmental state of the outside. The sensor modules 104 and 119, for example, may include a first sensor module 104 (e.g., a proximity sensor) and a second sensor module (not illustrated) (e.g., a fingerprint sensor) disposed on the first surface 110A of the housing 110, and/or a third sensor module 119 (e.g., a HRM sensor) disposed on the second surface 110B of the housing 110. The fingerprint sensor may be disposed not only on the first surface 110A (e.g., a home key button 115) but also the second surface 110B of the housing 110. The electronic device 100 may further include a sensor module (not illustrated), for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illumination sensor 104.

The camera modules 105, 112, and 113 may include a first camera device 105 disposed on the first surface 110A of the electronic device 100, and a second camera device 112 and/or a flash 113 disposed on the second surface 110B. The camera modules 105 and 112 may include one or a plurality of lenses, an image sensor, and/or an image signal processor. The flash 113, for example, may include a light emitting diode or a xenon lamp. In some embodiments, two or more lenses (a wide angle/telephoto lens), and image sensors may be disposed on one surface of the electronic device 100.

The key input devices 115, 116, and 117 may include a home key button 115 disposed on the first surface 110A of the housing 110, a touch pad 116 disposed around the home key button 115, and/or a side key button 117 disposed on the side surface 110C of the housing 110. In another embodiment, the electronic device 100 may not include some or all of the above-mentioned key input devices 115, 116, and 117, and the key input devices 115, 116, and 117 which are not included, may be realized in different forms, such as a soft key, on the display 101.

The indicator 106, for example, may be disposed on the first surface 110A of the housing 110. The indicator 106, for example, may provide state information on the electronic device 100 in the form of light, and may include an LED.

The collector holes 108 and 109 may include a first connector hole 108 that may accommodate a connector (e.g., a USB connector) for transmitting and receiving electric power and/or data to and from an external electronic device and/or a second connector hole (or an earphone jack) 109 that may accommodate a connector for transmitting and receiving an audio signal to and from the external device.

Figure 1C:
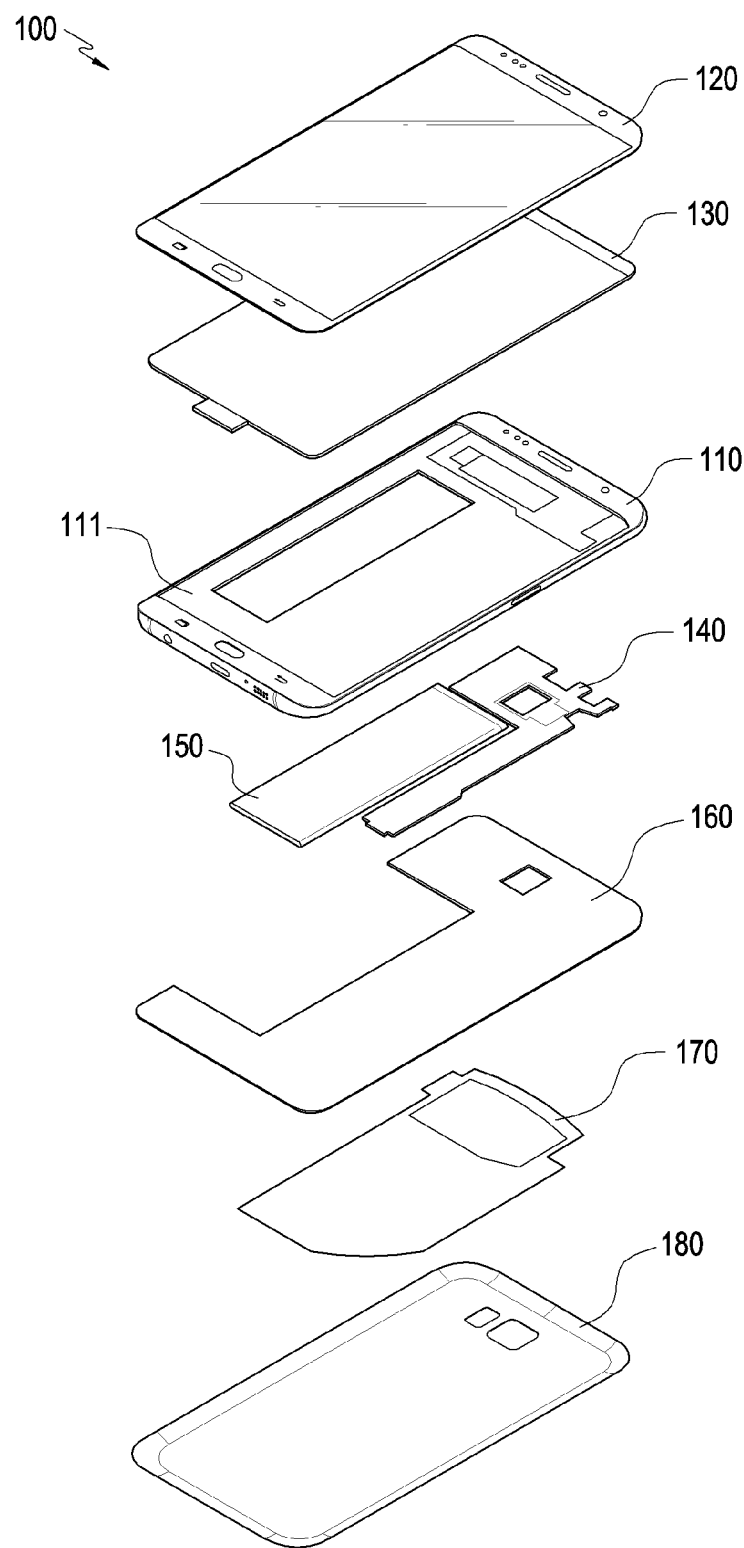
FIG. 1C is an exploded perspective view illustrating an electronic device according to various embodiments of the disclosure.

Referring to FIG. 1C, an electronic device 100 may include a side bezel structure 110, a first support member 111 (e.g., a bracket), a front plate 120, a display 130, a printed circuit board 140, a battery 150, a second support member 160 (e.g., a rear case), an antenna 170, and a rear plate 180. In some embodiments, at least one (e.g., the first support member 111 or the second support member 160) of the elements may be omitted from the electronic device 100 or another component may be additionally included in the electronic device 100. At least one of the components of the electronic device 100 may be the same as or similar to at least one of the components of the electronic device 100 of FIGS. 1A and 1B, and a repeated description thereof will be omitted.

The first support member 111 may be disposed in the interior of the electronic device 100 to be connected to the side bezel structure 110 or to be integrally formed with the side bezel structure 110. The first support member 111, for example, may be formed of a metallic material and/or a nonmetallic material (e.g., a polymer). The display 130 may be coupled to one surface of the first support member 111, and the printed circuit board 140 may be coupled to an opposite surface of the first support member 111. A processor, a memory, and/or an interface may be mounted on the printed circuit board 140. The processor, for example, may include one or more of a central processing unit, an application processor, a graphic processing unit, an image signal processor, a sensor hub processor, or a communication processor.

The memory, for example, may include a volatile and/or nonvolatile memory.

The interface, for example, may include a high definition multimedia interface (HDMI), a universal serial bus (USB), an SD card interface, and/or an audio interface. The interface, for example, may electrically or physically connect the electronic device 100 to an external electronic device, and may include a USB connector, an SD card/MMC connector, and an audio connector.

The battery 150 is a device for supplying electric power to at least one component of the electronic device 100, and for example, may include a primary battery that cannot be recharged, a secondary battery that may be recharged, or a fuel cell. At least a portion of the battery 150, for example, may be disposed on substantially the same plane as the printed circuit board 140. The battery 150 may be integrally disposed in the interior of the electronic device 100, and may be disposed to be detachable from the electronic device 100.

The antenna 170 may be disposed between the rear plate 180 and the battery 150. The antenna 170, for example, may include a near field communication (NFC) antenna, a wireless charging antenna, and/or a magnetic secure transmission (MST) antenna. The antenna 170, for example, may perform short-range communication with an external device, or may wirelessly transmit and receive electric power that is necessary for charging. In another embodiment, an antenna structure may be formed by one or a combination of the side bezel structure 110 and/or the first support member 111.

Figure 2:
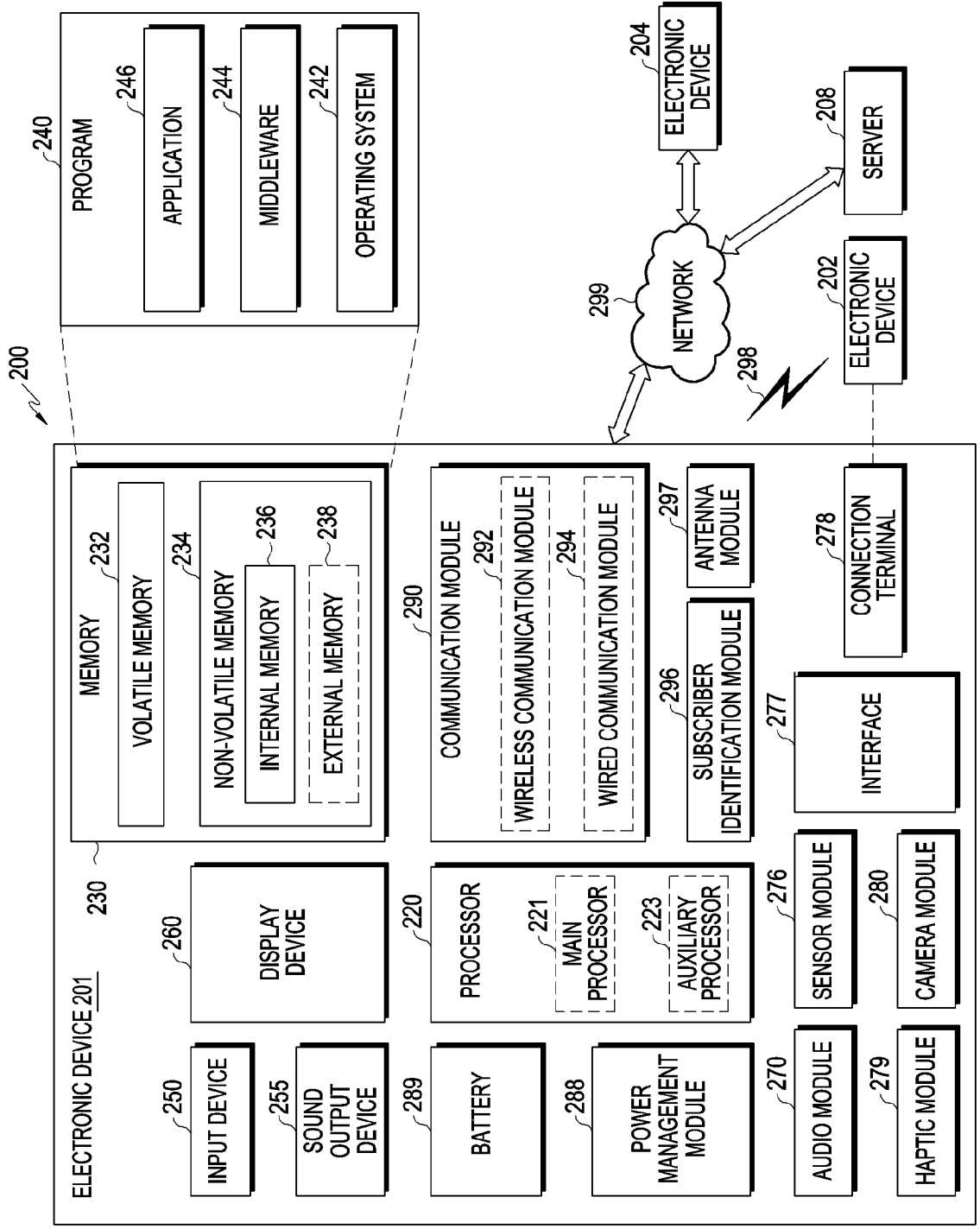
FIG. 2 is a block diagram of an electronic device in a network environment according to various embodiments of the disclosure.

FIG. 2 is a block diagram illustrating an electronic device 201 in a network environment 200 according to various embodiments. Referring to FIG. 2, the electronic device 201 in the network environment 200 may communicate with an electronic device 202 via a first network 298 (e.g., a short-range wireless communication network), or an electronic device 204 or a server 208 via a second network 299 (e.g., a long-range wireless communication network). According to an embodiment, the electronic device 201 may communicate with the electronic device 204 via the server 208. According to an embodiment, the electronic device 201 may include a processor 220, memory 230, an input device 250, a sound output device 255, a display device 260, an audio module 270, a sensor module 276, an interface 277, a haptic module 279, a camera module 280, a power management module 288, a battery 289, a communication module 290, a subscriber identification module (SIM) 296, or an antenna module 297. In some embodiments, at least one (e.g., the display device 260 or the camera module 280) of the components may be omitted from the electronic device 201, or one or more other components may be added in the electronic device 201. In some embodiments, some of the components may be implemented as single integrated circuitry. For example, the sensor module 276 (e.g., a fingerprint sensor, an iris sensor, or an illuminance sensor) may be implemented as embedded in the display device 260 (e.g., a display).

The processor 220 may execute, for example, software (e.g., a program 240) to control at least one other component (e.g., a hardware or software component) of the electronic device 201 coupled with the processor 220, and may perform various data processing or computation. According to one embodiment, as at least part of the data processing or computation, the processor 220 may load a command or data received from another component (e.g., the sensor module 276 or the communication module 290) in volatile memory 232, process the command or the data stored in the volatile memory 232, and store resulting data in non-volatile memory 234. According to an embodiment, the processor 220 may include a main processor 221 (e.g., a central processing unit (CPU) or an application processor (AP)), and an auxiliary processor 223 (e.g., a graphics processing unit (GPU), an image signal processor (ISP), a sensor hub processor, or a communication processor (CP)) that is operable independently from, or in conjunction with, the main processor 221. Additionally or alternatively, the auxiliary processor 223 may be adapted to consume less power than the main processor 221, or to be specific to a specified function. The auxiliary processor 223 may be implemented as separate from, or as part of the main processor 221.

The auxiliary processor 223 may control, for example, at least some of functions or states related to at least one component (e.g., the display device 260, the sensor module 276, or the communication module 290) among the components of the electronic device 201, instead of the main processor 221 while the main processor 221 is in an inactive (e.g., sleep) state, or together with the main processor 221 while the main processor 221 is in an active (e.g., executing an application) state. According to an embodiment, the auxiliary processor 223 (e.g., an image signal processor or a communication processor) may be implemented as part of another component (e.g., the camera module 280 or the communication module 290) functionally related to the auxiliary processor 223.

The memory 230 may store various data used by at least one component (e.g., the processor 220 or the sensor module 276) of the electronic device 201. The various data may include, for example, software (e.g., the program 240) and input data or output data for a command related thereto. The memory 230 may include the volatile memory 232 or the non-volatile memory 234.

The program 240 may be stored in the memory 230 as software, and may include, for example, an operating system (OS) 242, middleware 244, or an application 246.

The input device 250 may receive a command or data to be used by a component (e.g., the processor 220) of the electronic device 201, from the outside (e.g., a user) of the electronic device 201. The input device 250 may include, for example, a microphone, a mouse, or a keyboard.

The sound output device 255 may output sound signals to the outside of the electronic device 201. The sound output device 255 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 260 may visually provide information to the outside (e.g., a user) of the electronic device 201. The display device 260 may include, for example, a display, a hologram device, or a projector and control circuitry to control a corresponding one of the display, hologram device, and projector. According to an embodiment, the display device 260 may include touch circuitry adapted to detect a touch, or sensor circuitry (e.g., a pressure sensor) adapted to measure the intensity of force incurred by the touch.

The audio module 270 may convert a sound into an electrical signal and vice versa. According to an embodiment, the audio module 270 may obtain the sound via the input device 250, or output the sound via the sound output device 255 or an external electronic device (e.g., an electronic device 202 (e.g., a speaker or a headphone)) directly or wirelessly coupled with the electronic device 201.

The sensor module 276 may detect an operational state (e.g., power or temperature) of the electronic device 201 or an environmental state (e.g., a state of a user) external to the electronic device 201, and then generate an electrical signal or data value corresponding to the detected state. According to an embodiment, the sensor module 276 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 277 may support one or more specified protocols to be used for the electronic device 201 to be coupled with the external electronic device (e.g., the electronic device 202) directly or wirelessly. According to an embodiment, the interface 277 may include, for example, a high definition multimedia interface (HDMI), a universal serial bus (USB) interface, a secure digital (SD) card interface, or an audio interface.

A connecting terminal 278 may include a connector via which the electronic device 201 may be physically connected with the external electronic device (e.g., the electronic device 202). According to an embodiment, the connecting terminal 278 may include, for example, a HDMI connector, a USB connector, a SD card connector, or an audio connector (e.g., a headphone connector).

The haptic module 279 may convert an electrical signal into a mechanical stimulus (e.g., a vibration or a movement) or electrical stimulus which may be recognized by a user via his tactile sensation or kinesthetic sensation. According to an embodiment, the haptic module 279 may include, for example, a motor, a piezoelectric element, or an electric stimulator.

The camera module 280 may capture a still image or moving images. According to an embodiment, the camera module 280 may include one or more lenses, image sensors, image signal processors, or flashes.

The power management module 288 may manage power supplied to the electronic device 201. According to one embodiment, the power management module 388 may be implemented as at least part of, for example, a power management integrated circuit (PMIC).

The battery 289 may supply power to at least one component of the electronic device 201. According to an embodiment, the battery 289 may include, for example, a primary cell which is not rechargeable, a secondary cell which is rechargeable, or a fuel cell.

The communication module 290 may support establishing a direct (e.g., wired) communication channel or a wireless communication channel between the electronic device 201 and the external electronic device (e.g., the electronic device 202, the electronic device 204, or the server 208) and performing communication via the established communication channel. The communication module 290 may include one or more communication processors that are operable independently from the processor 220 (e.g., the application processor (AP)) and supports a direct (e.g., wired) communication or a wireless communication. According to an embodiment, the communication module 290 may include a wireless communication module 292 (e.g., a cellular communication module, a short-range wireless communication module, or a global navigation satellite system (GNSS) communication module) or a wired communication module 294 (e.g., a local area network (LAN) communication module or a power line communication (PLC) module). A corresponding one of these communication modules may communicate with the external electronic device via the first network 298 (e.g., a short-range communication network, such as Bluetooth™, wireless-fidelity (Wi-Fi) direct, or infrared data association (IrDA)) or the second network 299 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 292 may identify and authenticate the electronic device 201 in a communication network, such as the first network 298 or the second network 299, using subscriber information (e.g., international mobile subscriber identity (IMSI)) stored in the subscriber identification module 296.

The antenna module 297 may transmit or receive a signal or power to or from the outside (e.g., the external electronic device) of the electronic device 201. According to an embodiment, the antenna module 297 may include a plurality of antennas. In such a case, at least one antenna appropriate for a communication scheme used in the communication network, such as the first network 298 or the second network 299, may be selected, for example, by the communication module 290 from the plurality of antennas. The signal or the power may then be transmitted or received between the communication module 290 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 201 and the external electronic device 204 via the server 208 coupled with the second network 299. Each of the electronic devices 202 and 204 may be a device of a same type as, or a different type, from the electronic device 201. According to an embodiment, all or some of operations to be executed at the electronic device 201 may be executed at one or more of the external electronic devices 202, 204, or 208. For example, if the electronic device 201 should perform a function or a service automatically, or in response to a request from a user or another device, the electronic device 201, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 201. The electronic device 201 may provide the outcome, with or without further processing of the outcome, as at least part of a reply to the request. To that end, a cloud computing, distributed computing, or client-server computing technology may be used, for example.

Figure 3A:
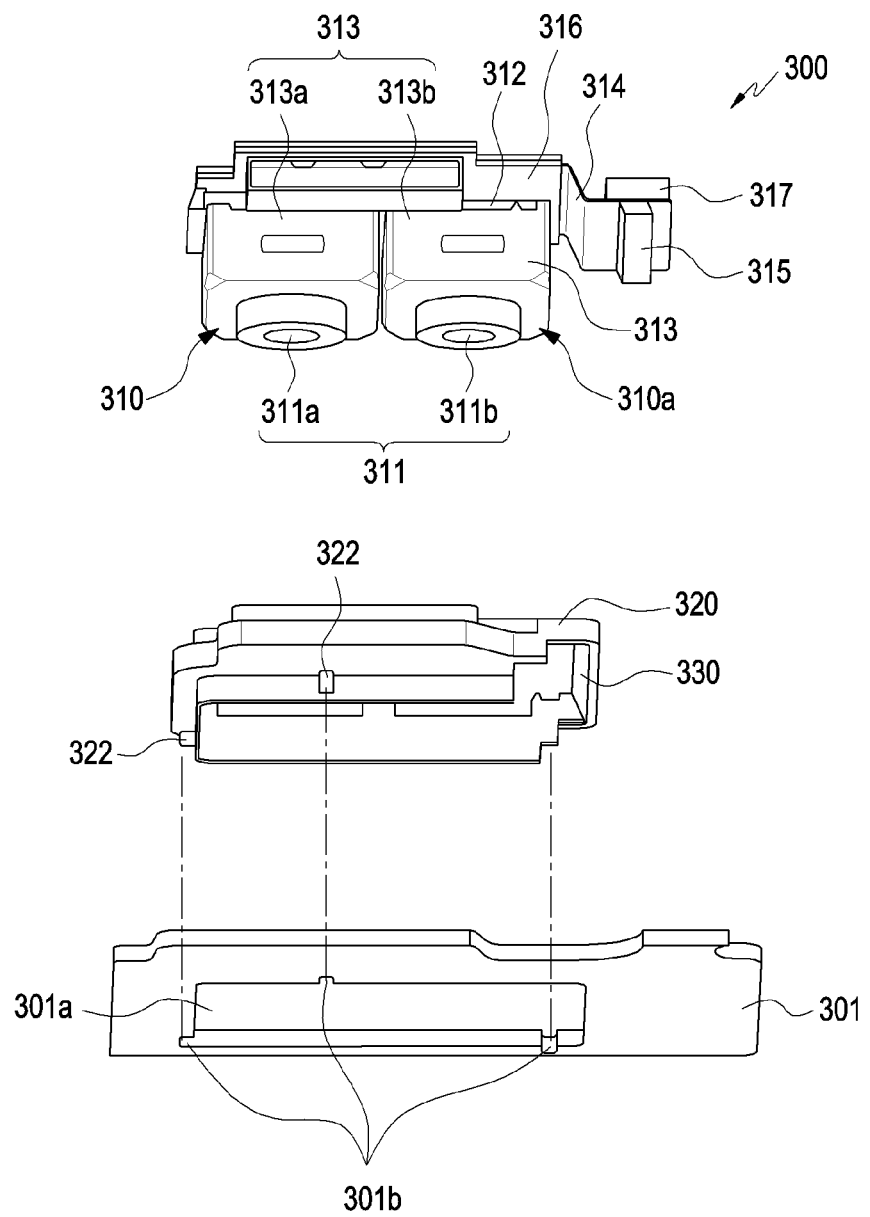
FIG. 3A is an exploded perspective view illustrating a configuration of a camera module assembly according to various embodiments of the disclosure.
Figure 3B:
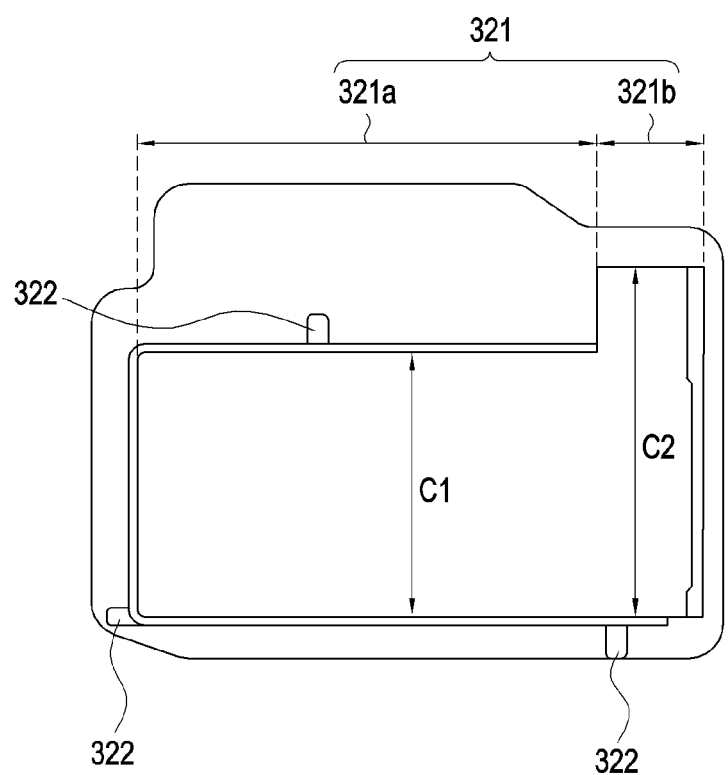
FIG. 3B is a plan view illustrating a support member, among configurations of a camera module assembly according to various embodiments of the disclosure.

FIG. 3A is an exploded perspective view illustrating a configuration of a camera module assembly 300 according to various embodiments of the disclosure. FIG. 3B is a plan view illustrating a support member 320, among configurations of a camera module assembly 300 according to various embodiments of the disclosure.

Referring to FIGS. 3A and 3B, a camera module assembly 300 according to various embodiments, for example, may include at least one camera module and a support member 320. The at least one camera module may include a lens assembly 311 including lenses, an image sensor 312 configured to receive light that passed through the lens assembly 311, a camera housing 313 configured to accommodate the lens assembly 311 and the image sensor 312, a circuit board 316, in which the image sensor 312 is disposed, and a flexible printed circuit board 314 electrically connected to the circuit board 316 and including a wiring line (not illustrated) and a connector 315 that connect the image sensor 312 and an external device (not illustrated) (for example, the processor (e.g., 220 of FIG. 2))

The at least one camera module may include a first camera module 310 or a second camera module 310a, the first camera module 310 may include a first lens assembly 311a, a first camera housing 313a, a circuit board 316, in which a first image sensor (not illustrated) is disposed, and a flexible circuit board 314 electrically connected to the circuit board 316, and the second camera module 310a may include a second lens assembly 311b, a second camera housing 311b, the circuit board 316, in which a second image sensor 312 is disposed, and the flexible circuit board 314 electrically connected to the circuit board 316. According to various embodiments, the first image sensor (not illustrated) and the second image sensor may be integrated into one image sensor.

At least a portion of the support member 320 may include an opening 321 to accommodate the at least one camera module 310.

In this way, because the support member 320 includes a guide part 330 that guides the flexible circuit board 314 such that at least a portion of the flexible circuit board 314 is maintained at or fixed to at least a location of the opening 321 in a bent state, the flexible circuit board 314 is guided in a state in which the flexible circuit board 314 is bent by the guide part 330 and is guided to a precise location, at which the flexible circuit board 314 is easily assembled while the location of the connector 315 of the flexible circuit board 314 is not changed, and the connector 315 of the flexible circuit board 314 guided to the precise location may be assembled in a connection terminal (not illustrated) included in the printed circuit board 301, and accordingly, the connector 315 of the flexible circuit board 314 and the connection terminal (not illustrated) of the printed circuit board 301 can be easily assembled, the assembly performance of the flexible circuit board 314 can be improved, and the damage to the connector 315 and the failure rate of the assembly of the connector 315 can be prevented.

According to an embodiment, the connector 315 of the flexible circuit board 314 may be included on one surface of the connector 315, and a support part 317 may be provided to support a force that presses the connector 315 when the connector 315 is coupled to a connection terminal (not illustrated) of the printed circuit board 301. For example, if the connector 315 and the connection terminal (not illustrated) are made to face each other to be coupled to each other and the support 317 is pressed while being gripped, the pressing force of the support connector 317 may be delivered to the connector 315, and may be coupled to the connection terminal (not illustrated) while the connector 315 is pressed.

As in FIG. 3B mentioned above, the support member 320 may include an opening 321 that is coupled to the first and second camera housing 313a and 313b therethrough and is coupled to the flexible circuit board 314 therethrough.

The opening 321 may include a first area 321a or a second area 321b. For example, the first area 321a may be formed in the support member 320 to be coupled to the first and second camera housings 313a and 313b therethrough, and the second area 321b may extend from at least a portion of the first area 321a, may include the guide part 330, and may be disposed to guide the flexible circuit board 314 such that the flexible circuit board 314 passes through the second area 321b.

According to an embodiment, the width C2 of the second area 321b may be larger than the width C1 of the first area 321a such that the flexible circuit board 314 may be easily coupled to the second area 321b therethrough. The second area 321b may be easily coupled to the flexible circuit board 314 therethrough.

According to an embodiment, the first and second camera housings 313a and 313b may be coupled to the first area 321a therethrough, and the flexible circuit board 314 may pass through the second are 321b and protrude to the outside of the support member 320. Then, the flexible circuit board 314 may be maintained in a state in which the flexible circuit board 314 is guided by the guide part 330 disposed in the second area 321b and is bent.

Figure 4A:
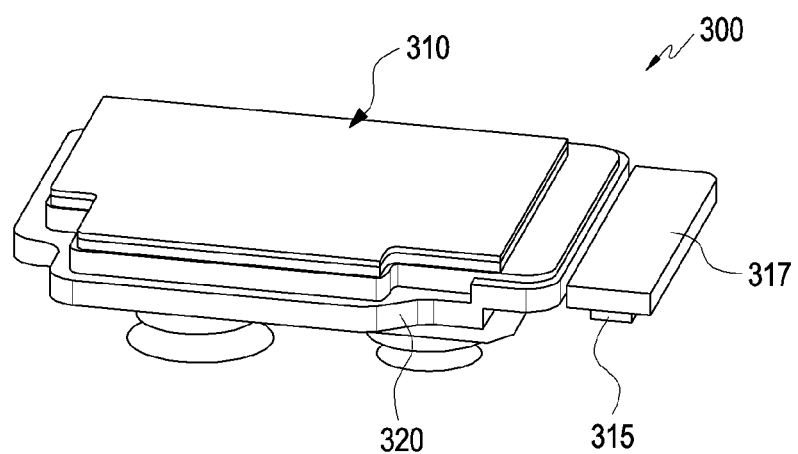
FIG. 4A is a perspective view illustrating a coupling state of a camera module assembly according to various embodiments of the disclosure.
Figure 4B:
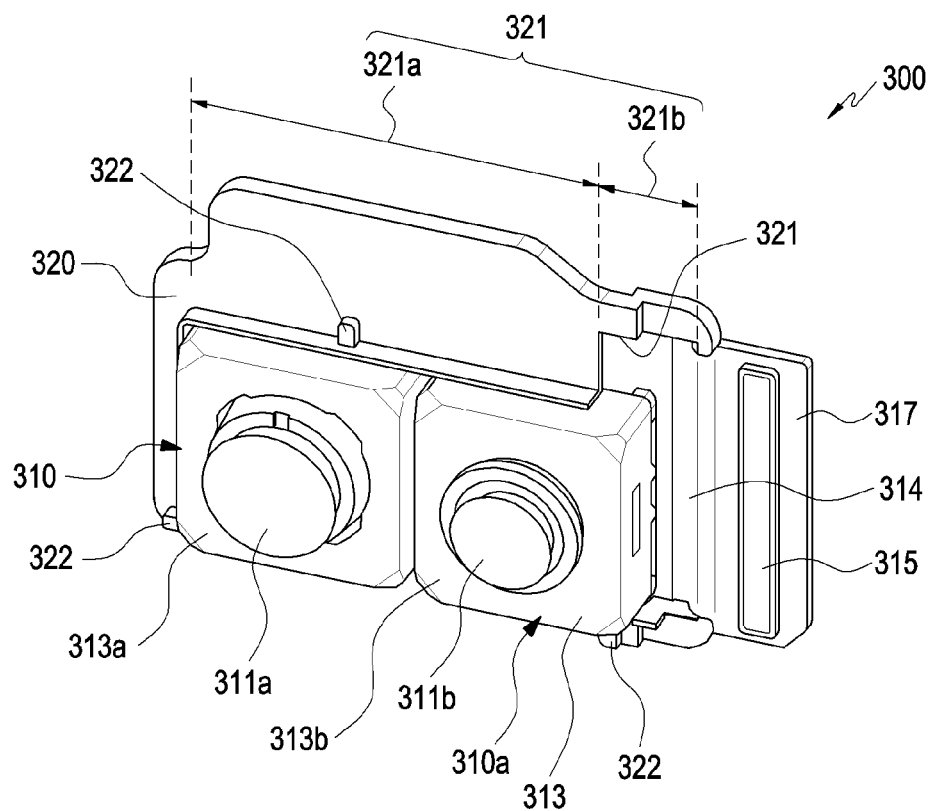
FIG. 4B is another perspective view illustrating a coupling state of a camera module assembly according to various embodiments of the disclosure.

FIG. 4A is a perspective view illustrating a coupling state of a camera module assembly 300 according to various embodiments of the disclosure. FIG. 4B is another perspective view illustrating a coupling state of a camera module assembly 300 according to various embodiments of the disclosure.

Referring to FIGS. 4A and 4B, at least a portion of the support member 320 may include an opening 321 to couple the first and second camera modules 310 and 310a and the flexible circuit board 314. For example, the first and second camera housings 313a and 313b including the first and second lens assembly 311a and 311b, the first image sensor (not illustrated), and the second image sensor (e.g., 312 of FIG. 3A) are coupled to the first area 321a of the opening 321, and the image sensor (e.g., 312 of FIG. 3A) and the flexible circuit board 314 are inserted into and coupled to the second area 321*b* of the opening 321 and the connector 315 of the flexible circuit board 314 may protrude to the outside of the second area 321*b*. Then, the flexible circuit board 314 may pass through the guide part 330 formed at least a location of the second area 321*b* and the guide part 330 may guide the flexible circuit board 314 in a state in which the flexible circuit board 314 is bent. For example, the guide part 330 may guide the flexible circuit board 314 such that the flexible circuit board 314 is seated in a state in which the flexible circuit board 314 is bent. Accordingly, the flexible circuit board 314 may be maintained in the second area 321*b* in a state in which the flexible circuit board 314 is bent by the guide part 330, and accordingly, the connector 315 of the flexible circuit board 314 may be positioned at a precise location while the location of the connector 315 is not changed outside the second area 321*b*.

The support member 320 coupled in this way, as in FIG. 3A mentioned above, may be coupled to an accommodation part 301*a* of the printed circuit board 301. According to an embodiment, the support member 320 may include at least one protrusion 322 that is coupled to at least one coupling recess 301*b* formed in the accommodation part 301*a* to prevent movement of the support member 320. Accordingly, when the support member 320 is coupled to the accommodation part 301*a* of the printed circuit board 301, at least one protrusion 322 of the support member 320 may be coupled to the at least one coupling recess 301*b*, and accordingly, the support member 320 can be prevented from being moved in the accommodation part 301*a*.

Figure 5:
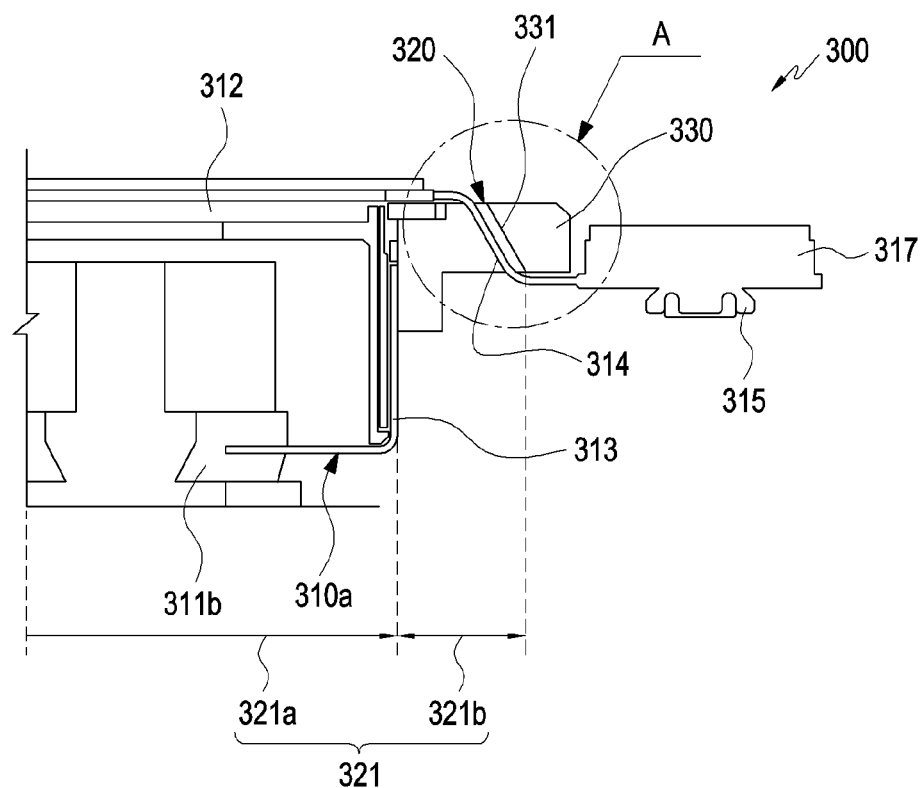
FIG. 5 is a side sectional view illustrating a coupling state of a camera module assembly according to various embodiments of the disclosure.
Figure 6:
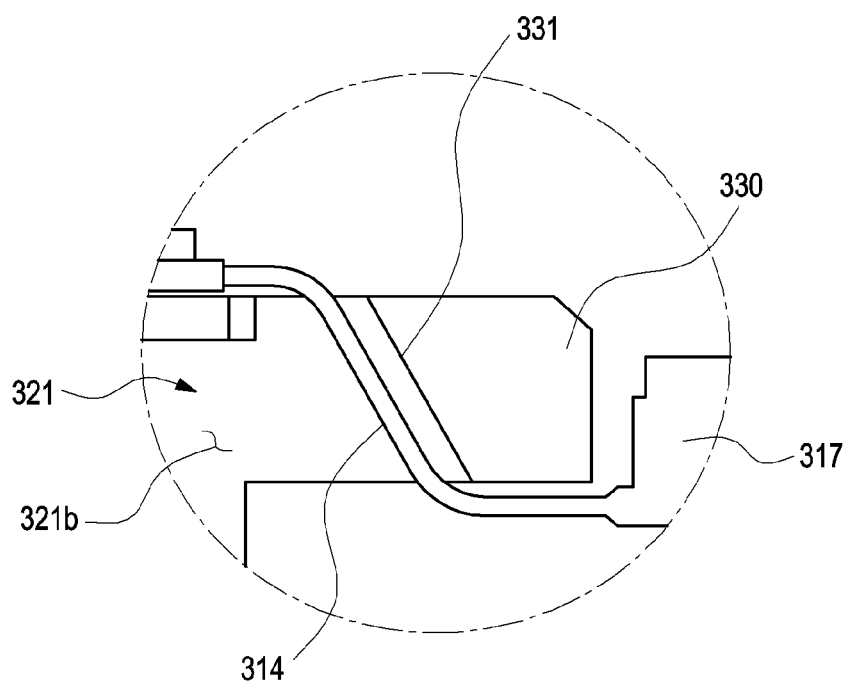
FIG. 6 is an enlarged sectional view of portion A of FIG. 5.

FIG. 5 is a side sectional view illustrating a coupling state of a camera module assembly 300 according to various embodiments of the disclosure. FIG. 6 is an enlarged sectional view of portion A of FIG. 5.

Referring to FIG. 5, the camera module assembly 300 may include a first camera module (e.g., 310 of FIG. 3A), a second camera module 310*a*, and a support member 320. The support member 320 may include an opening 321, and the opening 321 may include first and second areas 321*a* and 321*b*. The first camera module (e.g., 310 of FIG. 3A) may be inserted into and coupled to the first area 321*a*, and the flexible circuit boards 314 of the first and second camera modules 310 and 310*a* may be inserted into and coupled to the second area 321*b* therethrough. The connector 315 of the flexible circuit board 314 may be inserted into and pass through the second area 321*b*, and may protrude to the outside of the second area 321*b*. Then, the flexible circuit board 314 may be seated on the guide part 330 disposed at at least a location of the second area 321*b* and is maintained in a state in which at least a portion of the flexible circuit board 314 is bent by the guide part 330.

According to an embodiment, the guide part 330 may include at least one of a guide part having an inclined shape 331, a guide part having a curved shape 332, or a guide part having a circular shape 333. According to the embodiment, although it is exemplified that the guide part 330 is a guide part having an inclined shape 331, a guide part having a curved shape 332, or a guide part having a circular shape 333, the disclosure is not limited thereto. For example, as long as the guide part 330 has a configuration of guiding the flexible circuit board 314 such that the flexible circuit board 314 is maintained in a state in which the flexible circuit board 314 is bent, various configurations may be applied.

According to an embodiment, as in FIG. 6, the guide part 330 may include a guide part 330 having an inclined shape 331, and the guide part 330 of the inclined shape 331 may guide the flexible circuit board 314 according to a state in which the flexible circuit board 314 is bent. For example, the bent portion of the flexible circuit board 314 may face the inclined surface of the guide part 330 of the inclined shape 331. Accordingly, the flexible circuit board 314 may be maintained in a state in which the flexible circuit board 314 is bent while facing the guide part 330 of the inclined shape 331.

The assembled camera module assembly 300 may be mounted on an electronic device (e.g., 100 of FIG. 1). For example, the electronic device (e.g., 100 of FIG. 1) may include a housing including a front plate (e.g., 102 of FIG. 1), a rear plate (e.g., 111 of FIG. 1) facing an opposite direction to the front plate (e.g., 102 of FIG. 1), and a side surface (e.g., 110C of FIG. 1) surrounding a space between the front plate (e.g., 102 of FIG. 1) and the rear plate (e.g., 111 of FIG. 1). The front plate (e.g., 102 of FIG. 1) and the rear plate (e.g., 111 of FIG. 1) may include an at least partially transparent portion. The camera module assembly 300 may be located in the interior of the housing, and may be disposed below the at least partially transparent portion. The lens assembly 311 of the camera module assembly 300 may be disposed to face the at least partially transparent portion.

The camera module assembly 300 may include first and second camera modules 310 and 310*a*, and the first and second camera module 310 and 310*a* may include first and second lens assemblies 311*a* and 311*b*. The first and second lens assemblies 311*a* and 311*b* may deliver the light received from the outside through the at least partially transparent portion to the first image sensor (not illustrated) and the second image sensor 312. The first image sensor (not illustrated) and the second image sensor 312 may receive the light that passed through the first and second lens assemblies 311*a* and 311*b*, may convert the received light to an electrical signal, and may deliver the converted light signal to the processor (e.g., 220 of FIG. 2). The at least one processor (e.g., 220 of FIG. 2), for example, may identify a mode for generating an image corresponding to an object photographed from the outside by using the light signal, determine setting of at least one image attribute that is to be used for generating the image, at least based on the mode, generate image data by using pixel data corresponding to the light signal, at least based on the setting, and display the image corresponding to the object through a display (e.g., 101 of FIG. 1) connected to the electronic device (e.g., 201 of FIG. 2), at least based on the image data.

Figure 7:
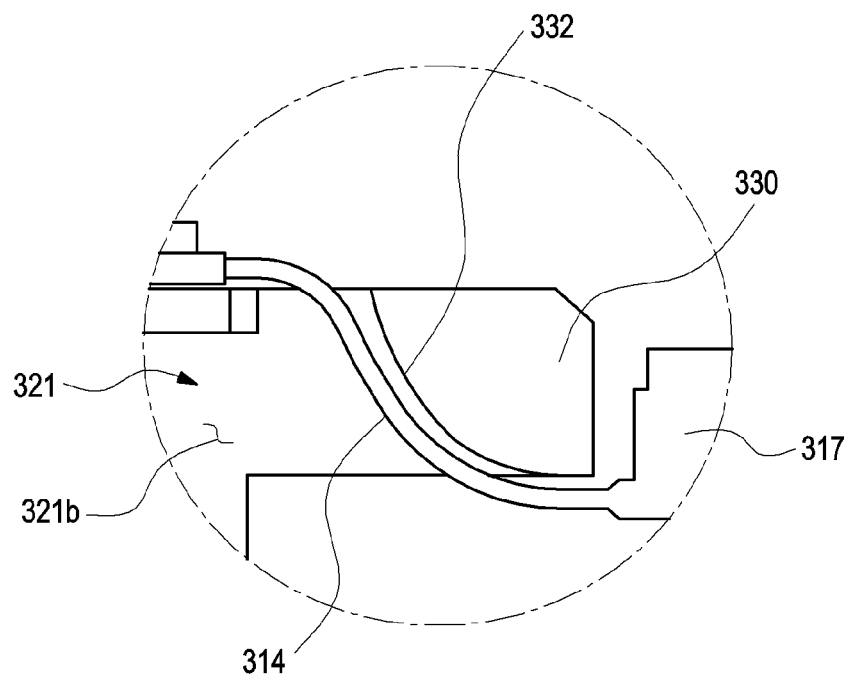
FIG. 7 is a side sectional view illustrating another embodiment of a guide part of a camera module assembly as an enlarged side sectional view of portion A of FIG. 5.

FIG. 7 is a side sectional view illustrating another embodiment of a guide part 330 of a camera module assembly 300 as an enlarged side sectional view of portion A of FIG. 5.

Referring to FIG. 7, the guide part 330 may include a guide part 330 having a curved shape 332. For example, the guide part 330 of the curved shape 331 may be configured such that the bent portion of the flexible circuit board 314 faces the curved shape 332. When the flexible circuit board 314 passes through the second area 321*b* of the opening 321, the bent portion of the flexible circuit board 314 may be pressed while facing the curved shape 332 of the guide part 330.

Accordingly, the flexible circuit board 314 may be guided and be maintained in a state in which the flexible circuit board 314 is bent by the guide part 330 having the curved shape 332. Accordingly, when the connector 315 of the flexible circuit board 314 is positioned at a precise location for coupling to the connection terminal (not illustrated) of the printed circuit board 301 and when the connector 315 and the connection terminal (not illustrated) are assembled in this state, the connector 315 and the connection terminal (not illustrated) may be assembled precisely. The guide part 330 having the curved shape 332 can facilitate the assembly of the connector 315 and the connection terminal (not illustrated), can improve the assembly of the flexible circuit board, and can prevent a damage to and generation of the failure rate of an assembly of the connector 315.

Figure 8:
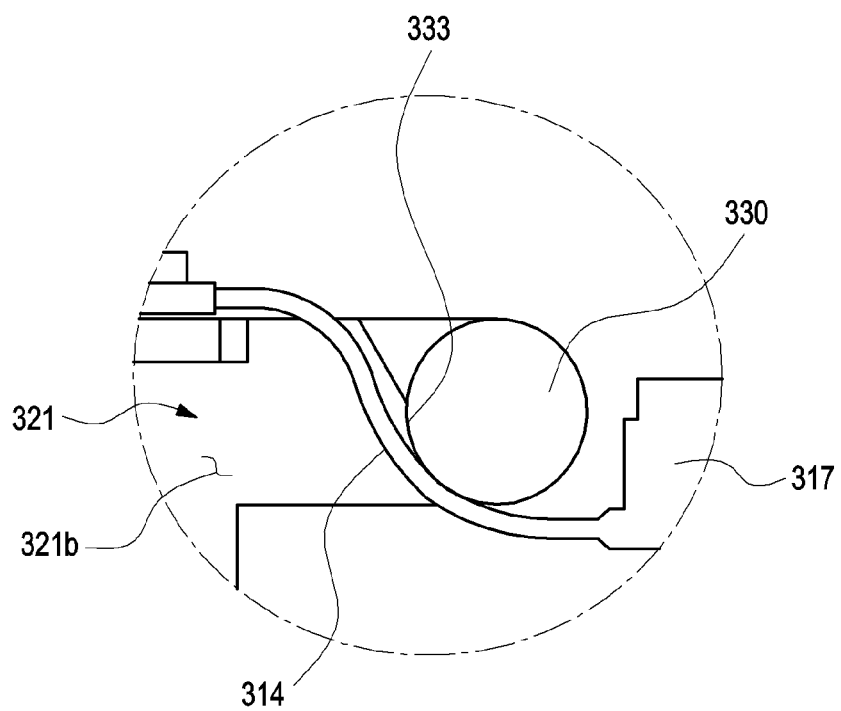
FIG. 8 is a side sectional view illustrating another embodiment of a guide part of a camera module assembly as an enlarged side sectional view of portion A of FIG. 5.

FIG. 8 is a side sectional view illustrating another embodiment of a guide part 330 of a camera module assembly 300 as an enlarged side sectional view of portion A of FIG. 5.

Referring to FIG. 8, the guide part 330 may include a guide part 333 having the circular shape 333. For example, the guide part 330 having the circular shape 333 may be configured such that the bent portion of the flexible circuit board 314 faces the circular shape 333. When the flexible circuit board 314 passes through the second area 321b of the opening 321, the bent portion of the flexible circuit board 314 may be pressed while facing the circular shape 333 of the guide part 330.

Accordingly, the flexible circuit board 314 may be guided and be maintained in a state in which the flexible circuit board 314 is bent by the guide part 330 having the circular shape 333. Accordingly, the connector 315 of the flexible circuit board 314 may be positioned at a proper location, and in this state, the connector 315 and the connection terminal (not illustrated) of the printed circuit board 301 can be precisely coupled to each other, the assembly of the connector 315 and the connection terminal (not illustrated) can be facilitated, the assembly of the flexible circuit board can be improved, and a damage to and generation of the failure rate of an assembly of the connector 315 can be prevented.

Figure 9:
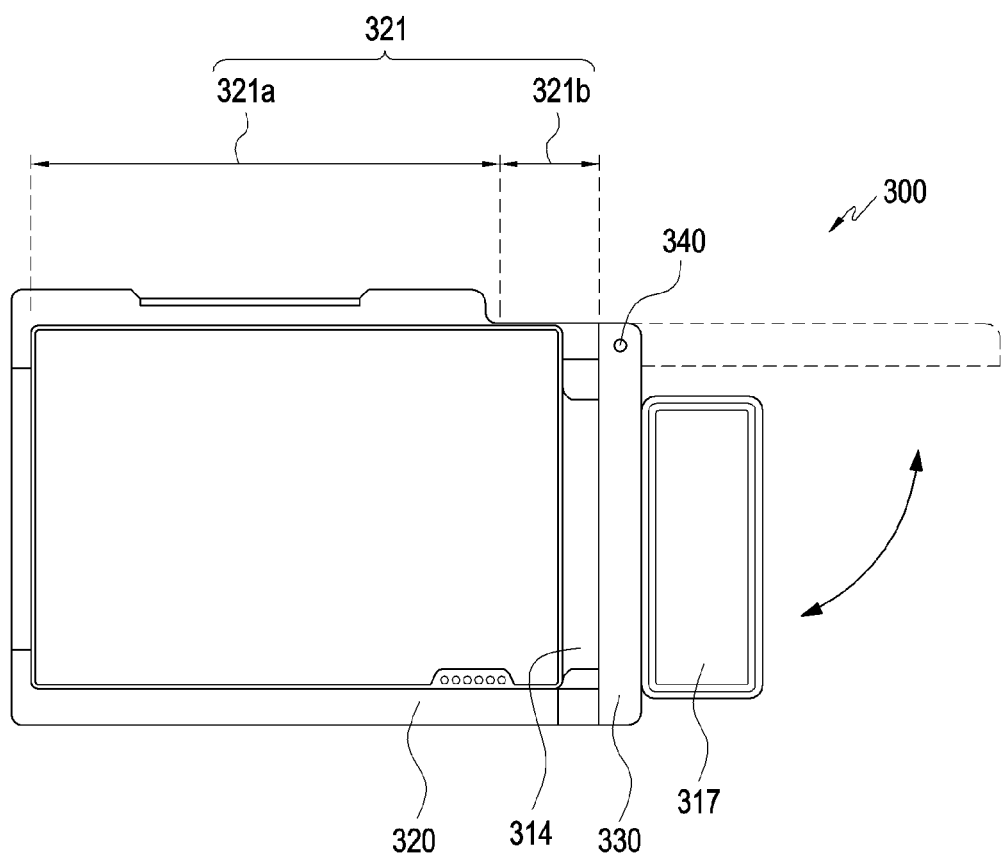
FIG. 9 is a plan view illustrating a configuration of a camera module assembly according to other various embodiments of the disclosure.

FIG. 9 is a plan view illustrating a support member 320, among configurations of a camera module assembly 300 according to other various embodiments of the disclosure.

Referring to FIG. 9, the support member 320 may include a hinge part 340 configured to rotate the guide part 330 to open and close the second area 321b of the opening 321. For example, the first camera module (e.g., 310 of FIG. 3A) and the second camera module (e.g., 310a of FIG. 3A) may be coupled to the first area 321a of the opening 321 of the support member 320, and the flexible circuit board 314 including the connector 315 connected to the second camera module (e.g., 310a of FIG. 3A) may be coupled to the second area 321b of the opening 321.

According to an embodiment, when the flexible circuit board 314 is coupled to the second area 321b, the guide part 330 disposed at at least a location of the second area 321b may be rotated by using the hinge part 340. For example, the guide part 330 may be rotated by the hinge part 340 and may open at least a portion of the second area 321b. The flexible circuit board 314 may be coupled to the at least portion of the second area 321b, which is opened, and in turn, the guide part 330 may be rotated by the hinge part 340 and the at least a portion of the second area 321b may be closed. Then, the guide part 330 may press one surface of the flexible circuit board 314, and may guide the flexible circuit board 314 such that at least a portion of the flexible circuit board 314 is bent. The guide part 330 may include a guide part 330 having the inclined shape 331. For example, the inclined surface of the guide part 330 having the inclined shape 331 may face one surface of the flexible circuit board 314.

In this way, the support member 320 includes a hinge part 340 such that at least a portion of the second area 321b of the opening 321 is opened and closed according to rotation of the guide part 330, and when the guide part 330 is rotated by the hinge part 340, at least a portion of the second area 321b may be opened and may couple the flexible circuit board 314 to the second area 321b, and in turn, the second area 321b may be rotated by the hinge part 340 and at least a portion of the second area 321b may be closed. Accordingly, the flexible circuit board 314 may be conveniently assembled in the second area 321b.

Figure 10A:
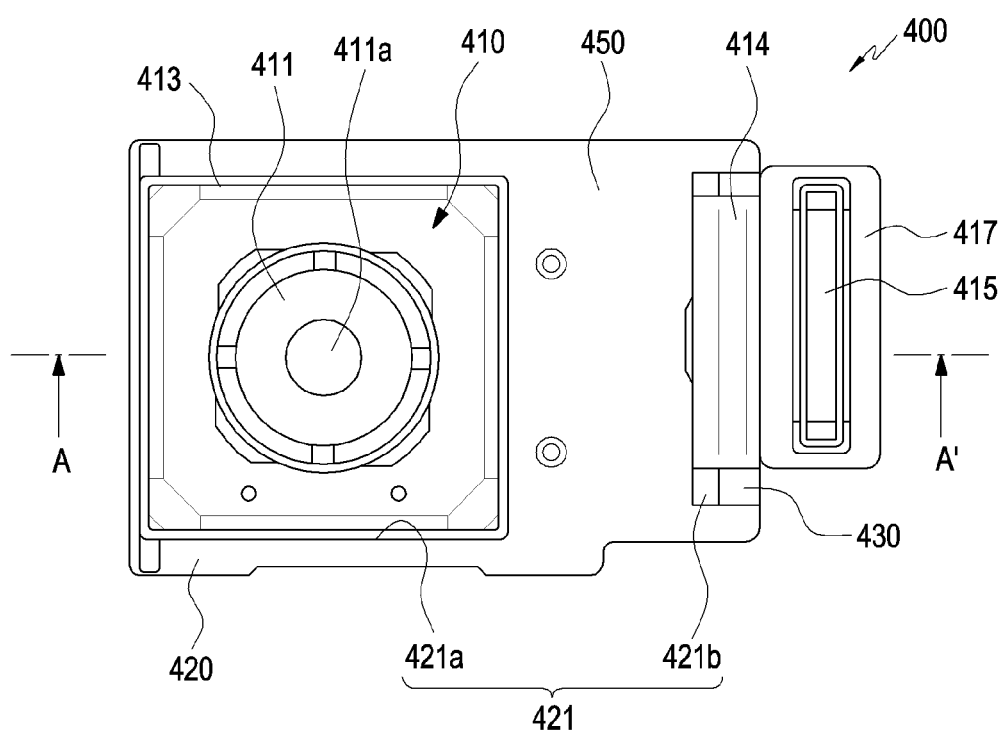
FIG. 10A is a front view illustrating a configuration of a camera module assembly according to other various embodiments of the disclosure.
Figure 10B:
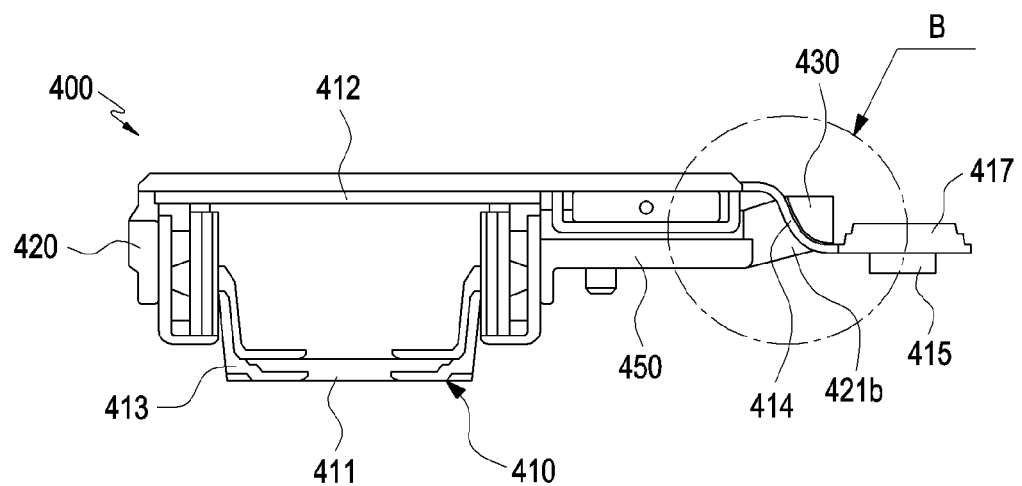
FIG. 10B is a line sectional view taken along line A-A' of FIG. 10A.
Figure 11:
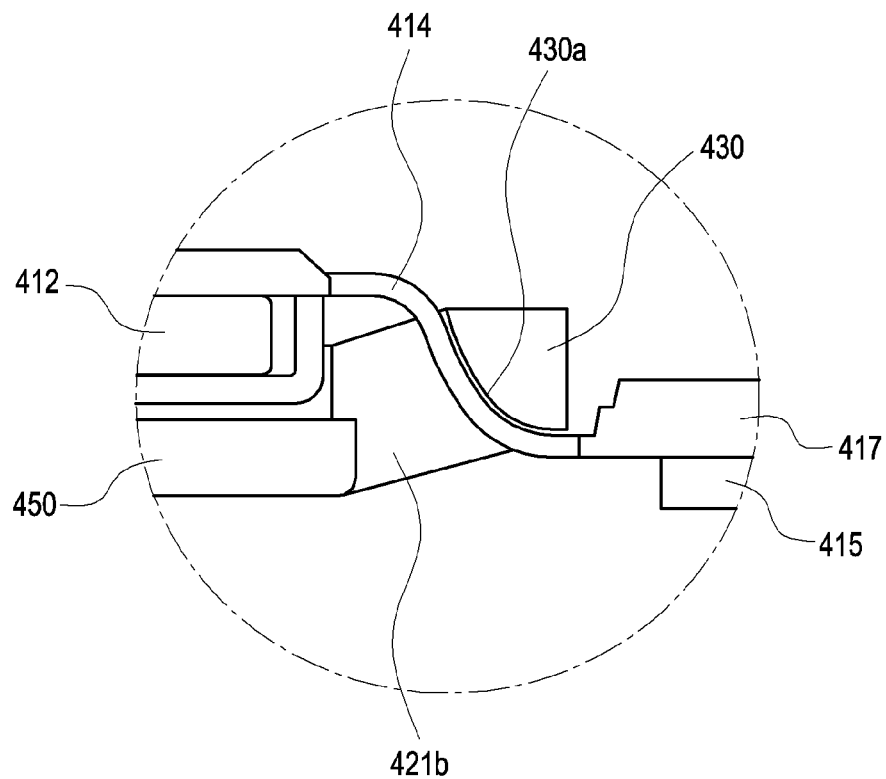
FIG. 11 is an enlarged line sectional view of portion B of FIG. 10B.

FIG. 10A is a front view illustrating a configuration of a camera module assembly 400 according to other various embodiments of the disclosure. FIG. 10B is a line sectional view taken along line A-A' of FIG. 10A. FIG. 11 is an enlarged line sectional view of portion B of FIG. 10B.

Referring to FIGS. 10A and 10B, a camera module assembly 400 according to various embodiments, for example, may include at least one camera module 410 and a support member 420. The at least one camera module 410 may include a lens assembly 411 including lenses 411a, an image sensor 412 configured to receive light that passed through the lens assembly 411, a camera housing 413 configured to accommodate the lens assembly 411 and the image sensor 412, a circuit board, in which the image sensor 412 is disposed, and a flexible printed circuit board 414 electrically connected to the circuit board and including a wiring line (not illustrated) and a connector 415 that connect the image sensor 412 and an external device (not illustrated).

According to an embodiment, the at least one camera module 410 may include a single camera module.

At least a portion of the support member 420 may include an opening 421 to accommodate the single camera module 410. The opening 421 may include a first opening 421a or a second opening 421b. The first opening 421a may be formed in the support member 420 to be coupled to the camera housing 413 therethrough. The second opening 421b may be formed at a location that is adjacent to the first opening 421a to guide the flexible circuit board 414 such that the flexible circuit board 414 is coupled to the second opening 421b therethrough.

The support member 420 may include a guide part 430 configured to guide the flexible circuit board 414 such that the flexible circuit board 414 is maintained at at least a location of the second opening 421b in a state in which at least a portion of the flexible circuit board 414 is bent.

A separation part 450 may be formed between the first opening 421a and the second opening 421b to separate the first opening 421a and the second opening 421b.

The guide part 430 may include at least one of a guide part having an inclined shape, a guide part having a curved shape, or a guide part having a circular shape.

According to an embodiment, as in FIG. 11, the guide part 430 may include a guide part having the curved shape 430a. For example, the guide part 430 of the curved shape 430a may be configured such that the bent portion of the flexible circuit board 414 faces the curved shape 430a. When the flexible circuit board 414 passes through the second opening 421b, the bent portion of the flexible circuit board 414 may be pressed while facing the curved shape 430a of the guide part 430. Accordingly, the flexible circuit board 414 may be guided and be maintained in a state in which the flexible circuit board 414 is bent by the guide part 430 having the curved shape. Accordingly, the connector 415 of the flexible circuit board 414 may be positioned at a precise location at which the connector 415 may be easily assembled. In this state, when the connector 415 and the connection terminal (not illustrated) of the printed circuit board (not illustrated) are assembled, the connector 415 and the connection terminal (not illustrated) can be precisely assembled.

Figure 12:
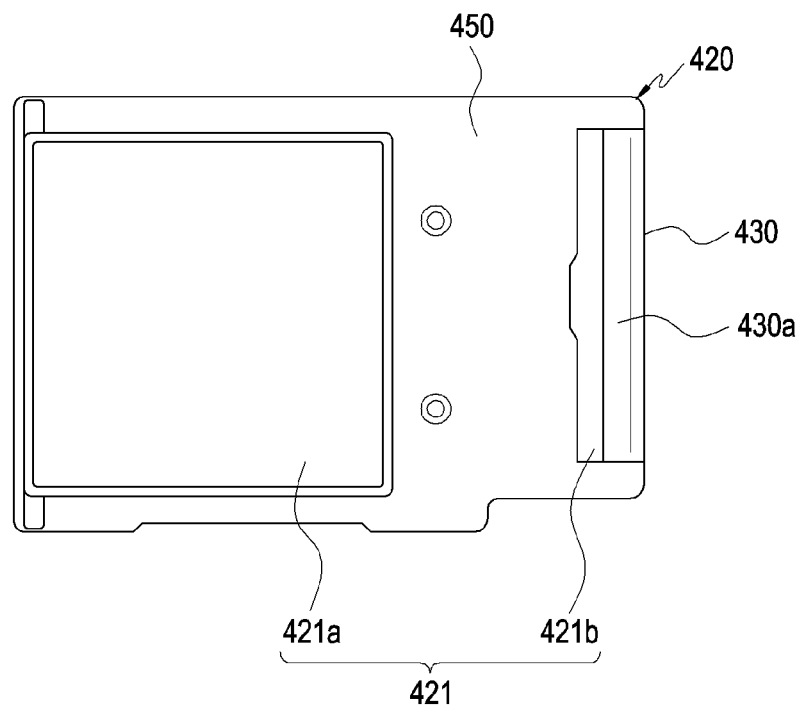
FIG. 12 is a front view illustrating a support member of a camera module assembly according to other various embodiments of the disclosure.

FIG. 12 is a front view illustrating a support member of a camera module assembly according to other various embodiments of the disclosure.

Referring to FIG. 12, the support member 420 may include a first opening 421a coupled to the camera housing (e.g., 413 of FIG. 10A) therethrough, and may include a second opening 421b coupled to the flexible circuit board (e.g., 414 of FIG. 10A) therethrough.

A separation part 450 may be formed between the first and second openings 421a and 421b to classify and separate the first and second openings 421a and 421b. The size of the second opening 421b may be formed to be smaller than the size of the first opening 421a.

According to an embodiment, the camera housing (e.g., 413 of FIG. 10A) may be coupled to the first opening 421a therethrough, and the flexible circuit board (e.g., 414 of FIG. 10A) may pass through the second opening 421b and protrude to the outside of the support member 420. Then, the flexible circuit board (e.g., 414 of FIG. 10A) may be guided by the guide part (e.g., 430 of FIG. 10A) disposed at at least a location of the second opening 421b and may be maintained in a bent state.

As in FIGS. 10A and 10B mentioned above, the support member 420 is not a structure in which the camera module 410 and the flexible circuit board 414 are coupled to one opening 421, and the camera module 410 may be separately coupled to the first opening 421a, and the flexible circuit board 414 may be separately coupled to the separated second opening 421b therethrough at a location that is adjacent to the first opening 421a. In this way, because the support member 420 includes a guide part 430 that guides the flexible circuit board 414 such that at least a portion of the flexible circuit board 414 is maintained at or fixed to at least a location of the second opening 421b in a bent state, the flexible circuit board 414 is guided in a state in which the flexible circuit board 414 is bent by the guide part 430 and is guided to a precise location, at which the flexible circuit board 414 is easily assembled while the location of the connector 415 of the flexible circuit board 414 is not changed, and the connector 415 of the flexible circuit board 414 guided to the precise location may be assembled in a connection terminal (not illustrated) included in the printed circuit board (not illustrated), and accordingly, the connector 415 of the flexible circuit board 414 and the connection terminal (not illustrated) of the printed circuit board (not illustrated) can be easily assembled, the assembly performance of the flexible circuit board 414 can be improved, and the damage to the connector 415 and the failure rate of the assembly of the connector 415 can be prevented.

Figure 13:
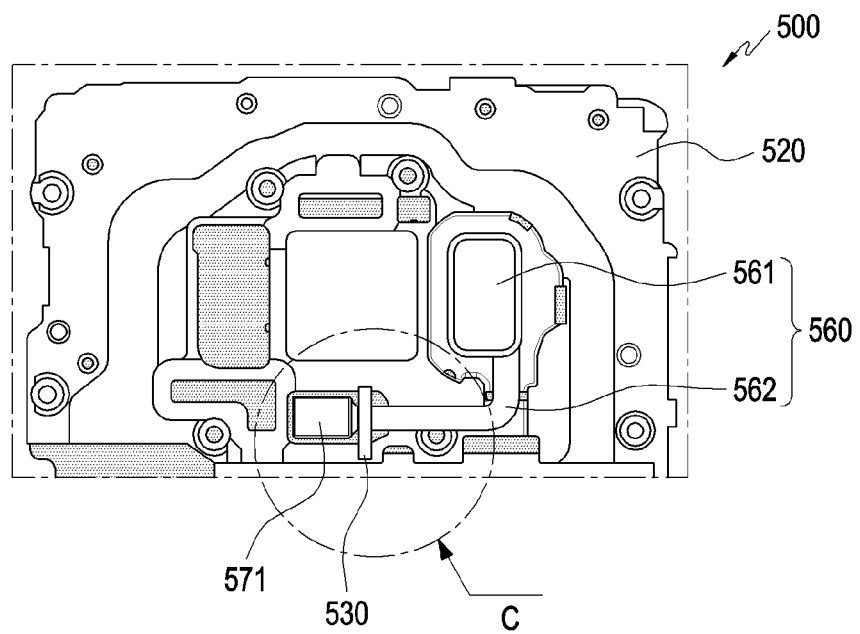
FIG. 13 is a plan view illustrating a state in which a guide part of a support member is applied to a rear case according to other various embodiments of the disclosure.
Figure 14:
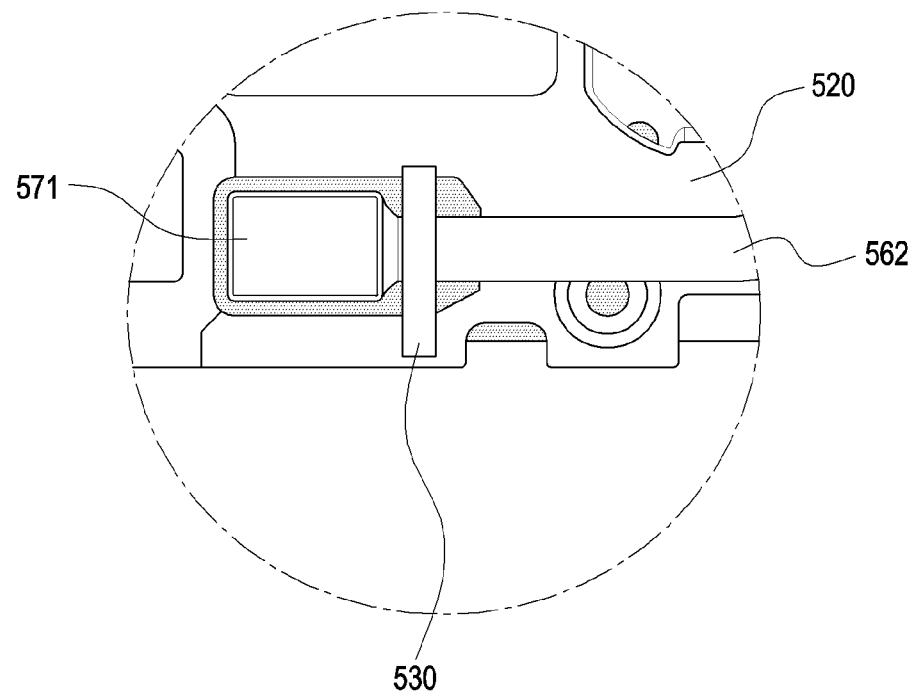
FIG. 14 is an enlarged plan view of portion C of FIG. 13.

FIG. 13 is a plan view illustrating a state in which a support member (e.g., 320 of FIG. 3A) is applied to a rear case 520 according to other various embodiments of the disclosure. FIG. 14 is an enlarged plan view of portion C of FIG. 13.

Referring to FIGS. 13 and 14, the support member (e.g., 320 of FIG. 3A) may include a rear case 520. For example, the rear case 520 may include a fingerprint recognition module 560. The fingerprint recognition module 560 may include a fingerprint key 561, and a flexible circuit board 562 including a wiring line and a connector 570 for connecting the fingerprint key 561 and a connection member (not illustrated) included in the electronic device (e.g., 100 of FIG. 1). For example, the fingerprint recognition module 560 may be electrically connected to the main board (e.g., 580 of FIG. 15) of the electronic device (e.g., 100 of FIG. 1) through the flexible circuit board 562.

The rear case 520 may include a guide part 530 that guides the flexible circuit board 562 such that at least a portion of the flexible circuit board 562 is fixed in a bent state while facing the at least a portion of the flexible circuit board 562.

The guide part 530 may include at least one of a guide part 530 having an inclined shape, a guide part 530 having a curved shape 530a, or a guide part 530 having a circular shape. In the present embodiment, a description will be made with reference to the guide part 530 having the curved shape 530a.

The rear case 520 may include a rear plate (e.g., 111 of FIG. 1B) of the electronic device (e.g., 100 of FIG. 1).

Figure 15:
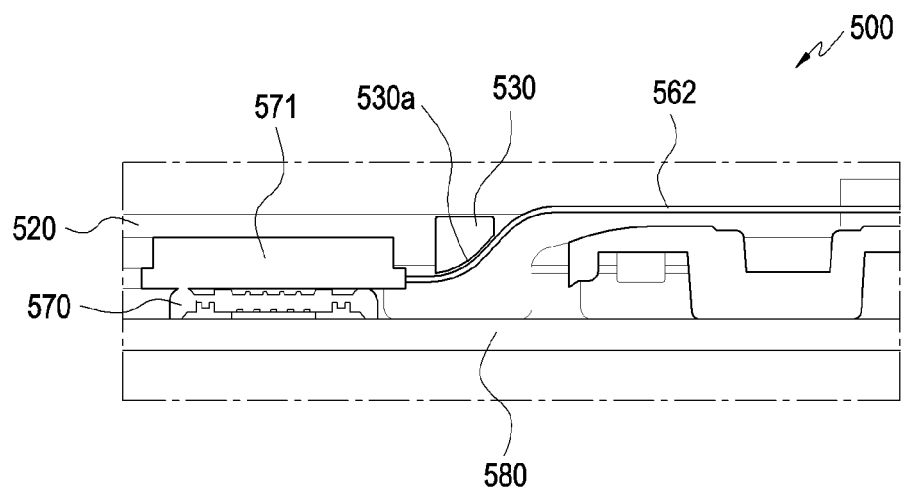
FIG. 15 is a side sectional view illustrating a state in which a guide part of a support member is applied to a rear case according to other various embodiments of the disclosure.

FIG. 15 is a side sectional view illustrating a state in which a support member (e.g., 320 of FIG. 3A) is applied to a rear case 520 according to other various embodiments of the disclosure.

Referring to FIG. 15, a fingerprint recognition module 560 may be mounted on the rear case 520. For example, a fingerprint key 561 of the fingerprint recognition module 560 may be coupled to the rear case 520, and the flexible circuit board 562 included in the fingerprint key 561 may be coupled to the guide part 530 having the curved shape 530a while facing the guide part 530. The flexible circuit board 562 may be maintained in a bent state while facing the curved portion of the guide part 530 having the curved shape 530a. The connector 570 of the flexible circuit board 562 assembled in this way may be connected to a connection member (not illustrated) included in the main board 580.

According to an embodiment, the fingerprint recognition module 560 mounted on the electronic device (e.g., 100 of FIG. 1) may include an image sensor die that acquires fingerprint information while a finger is slid and moved on a sensing surface of the fingerprint key 561. For example, the image sensor die may detect image information of a subject (e.g., a subject including information, such as a fingerprint, on a user authentication or the like), and convert the image information to an electrical signal. The processor (e.g., 120 of FIG. 1) may receive the fingerprint information acquired by the fingerprint recognition module 560 and store the received fingerprint information in a memory (e.g., 130 of FIG. 1), and may compare the fingerprint information of the user registered in advance with the acquired fingerprint information to determine whether they are the same.

In this way, the rear case 520 may include a guide part 530 that guides the flexible circuit board 562 of the fingerprint recognition module 560 such that the flexible circuit board 562 is maintained in a bent state, and the connector 570 of the flexible circuit board 562 may be assembled with the connection member (not illustrated) of the electronic device (e.g., 100 of FIG. 1) while the location of the connector 570 is not changed, and accordingly, the assembly performance of the flexible circuit board 562 can be improved, a damage to the connector 570 of the flexible circuit board 562 can be prevented, and a defect in the assembly can be prevented.

According to various embodiments of the disclosure, the camera module assembly 300 may include: at least one camera module 310 and 310a including a lens assembly 311, an image sensor 312 for receiving light that passed through the lens assembly, a camera housing 313 for accommodating the lens assembly and the image sensor, a circuit board 316, in which the image sensor is disposed, and a flexible printed circuit board 314 electrically connected to the circuit board and including a wiring line and a connector 315 that connect the image sensor and an external device; and a support member 320 including an opening 321 for accommodating the at least one camera module at at least a portion thereof, and the support member may be configured such that at least a portion of the flexible circuit board is maintained in a bent state through at least a portion of the opening.

According to various embodiments of the disclosure, the opening may include: a first area 321a formed in the support member and coupled to the camera housing therethrough; and a second area 321b extending from at least a portion of the first area and through which the flexible circuit board passes.

According to various embodiments of the disclosure, the width of the second area may be formed to be larger than the width of the first area.

According to various embodiments of the disclosure, the support member may include: a guide part 330 configured to guide the flexible circuit board such that at least a portion of the flexible circuit board is fixed in a bent state at at least a location of the second area.

According to various embodiments of the disclosure, the guide part may include: at least one of an inclined guide part, a curved guide part, or a circular guide part.

According to various embodiments of the disclosure, the at least one camera module 310 and 310a may include: a first camera housing 313a, a second camera housing 313b, a first lens assembly 311a, a second lens assembly 311b, a first image sensor, and a second image sensor 312.

According to various embodiments of the disclosure, the support member 320 may include at least one protrusion 322 coupled to at least one coupling recess 301b formed in an accommodation part 301a of the circuit board 301 and for preventing movement of the support member.

According to various embodiments of the disclosure, the camera module assembly may include: at least one camera module including a lens assembly, an image sensor for receiving light that passed through the lens assembly, a camera housing for accommodating the lens assembly and the image sensor, a circuit board, in which the image sensor is disposed, and a flexible printed circuit board electrically connected to the circuit board and including a wiring line and a connector for connecting the image sensor and an external device; and a support member including an opening for accommodating the at least one camera module at at least a portion thereof, and the support member may include a guide part configured to guide the flexible circuit board such that at least a portion of the flexible circuit board is maintained in a bent state through at least a location of the opening.

According to various embodiments of the disclosure, the opening 421 may include: a first opening 421a formed in the support member 420 and coupled to the camera housing therethrough; and a second opening 421b formed at a location that is adjacent to the first opening, including the guide part 430, and configured to guide the flexible circuit board 414 such that the flexible circuit board 414 is coupled to the second opening 421b therethrough.

According to various embodiments of the disclosure, a separation part 450 that separates the first and second openings may be formed between the first opening and the second opening.

According to various embodiments of the disclosure, the support member may include at least one of a front case or a rear case 520.

According to various embodiments of the disclosure, the support member may further include: a hinge part 340 that rotates the guide part to open and close the second area.

According to various embodiments of the disclosure, an electronic device including the camera module assembly may include: a housing including a front plate, a rear plate facing from a direction that is opposite to the front plate, and a side surface surrounding a space between the front plate and the rear plate, wherein the front plate and the rear plate include an at least partially transparent portion; at least one camera module including a lens assembly located in the interior of the housing and facing the at least partially transparent portion of the housing, an image sensor for receiving light that passed through the lens assembly, a camera housing for accommodating the lens assembly and the image sensor, a circuit board, in which the image sensor is disposed, and a flexible printed circuit board electrically connected to the circuit board and including a wiring line and a connector for connecting the image sensor and an external device; and a support member including an opening for accommodating the camera module at at least a portion thereof, and the support member may be configured such that at least a portion of the flexible circuit board is maintained in a bent state through at least a portion of the opening.

According to various embodiments of the disclosure, the support member may include: a guide part configured to guide the flexible circuit board such that at least a portion of the flexible circuit board is maintained in a bent state through at least a location of the opening.

According to various embodiments of the disclosure, the camera module assembly may include: at least one camera module including a flexible printed circuit board; and a support member including an opening for accommodating the at least one camera module, and the support member may include a guide part configured to guide the flexible circuit board such that at least a portion of the flexible circuit board is maintained in a bent state through at least a portion of the opening.

It is noted by those skilled in the art to which the disclosure pertains that the camera module assembly and the electronic device including the same according to various embodiments of the disclosure, which have been described above, are not limited by the above-mentioned embodiments and the drawings, but may be variously replaced, modified, and changed without departing from the scope of the disclosure.

The invention claimed is:

1. A camera module assembly comprising:
   at least one camera module comprising a lens assembly, an image sensor configured to receive light that passed through the lens assembly, a camera housing for accommodating the lens assembly and the image sensor, a circuit board, in which the image sensor is disposed, and a flexible printed circuit board electrically connected to the circuit board and comprising a wiring line and a connector for connecting the image sensor and an external device; and
   a support member comprising an opening for accommodating the at least one camera module at at least a portion thereof,
   wherein the support member is configured such that at least a portion of the flexible circuit board is maintained in a bent state through at least a portion of the opening.

2. The camera module assembly of claim 1, wherein the opening comprises:
   a first area formed in the support member and coupled to the camera housing therethrough; and
   a second area extending from at least a portion of the first area and through which the flexible circuit board passes.

3. The camera module assembly of claim 2, wherein the width of the second area is formed to be larger than the width of the first area.

4. The camera module assembly of claim 2, wherein the support member comprises:
a guide part configured to guide the flexible circuit board such that at least a portion of the flexible circuit board is maintained in a bent state at at least a location of the second area.

5. The camera module assembly of claim 4, wherein the guide part comprises:
at least one of an inclined guide part, a curved guide part, or a circular guide part.

6. The camera module assembly of claim 4, wherein the support member comprises at least one of a front case or a rear case, and
wherein the support member further comprises a hinge part configured to rotate the guide part to open and close the second area.

7. The camera module assembly of claim 1, wherein at least one camera module comprises a first lens assembly, a second lens assembly, a first camera housing, a second camera housing, a first image sensor, and a second image sensor.

8. The camera module assembly of claim 1, wherein the support member further comprises:
at least one protrusion coupled to at least one coupling recess formed in an accommodation part of the circuit board configured to prevent movement of the support member.

9. The camera module assembly of claim 1, wherein the support member comprises:
a guide part configured to guide the flexible circuit board such that at least a portion of the flexible circuit board is maintained in a bent state at at least a location of the opening.

10. The camera module assembly of claim 9, wherein the opening comprises:
a first opening formed in the support member and coupled to the camera housing therethrough; and
a second opening formed at a location that is adjacent to the first opening, comprising the guide part, and configured to guide the flexible circuit board such that the flexible circuit board is coupled to the second opening therethrough, and
wherein a separation part that separates the first and second openings is formed between the first opening and the second opening.

11. The camera module assembly of claim 1, comprising:
a housing comprising a front plate, a rear plate facing from a direction that is opposite to the front plate, and a side surface surrounding a space between the front plate and the rear plate, wherein the front plate and the rear plate comprise an at least partially transparent portion;
wherein the lens assembly is located in the interior of the housing and facing the at least partially transparent portion of the housing.

12. The camera module assembly of claim 11, wherein the opening comprises:
a first area formed in the support member and coupled to the camera housing therethrough; and
a second area extending from the first area and through which the flexible circuit board passes.

13. The camera module assembly of claim 12, wherein the support member comprises:
a guide part configured to guide the flexible circuit board such that at least a portion of the flexible circuit board is maintained in a bent state at at least a location of the second area.

* * * * *